United States Patent
Koshikawa

[11] Patent Number: 5,287,012
[45] Date of Patent: Feb. 15, 1994

[54] SEMICONDUCTOR INTEGRATED CIRCUIT EQUIPPED WITH DIAGNOSTIC CIRCUIT FOR CHECKING REFERENCE VOLTAGE SIGNAL SUPPLIED TO INTERNAL STEP-DOWN CIRCUIT

[75] Inventor: Yasuji Koshikawa, Tokyo, Japan

[73] Assignee: NEC Corporation, Tokyo, Japan

[21] Appl. No.: 901,689

[22] Filed: Jun. 22, 1992

[30] Foreign Application Priority Data

Jun. 25, 1991 [JP] Japan .................. 3-152684

[51] Int. Cl.[5] .................. H03K 5/24; H03K 3/01
[52] U.S. Cl. .................. 307/296.1; 307/350; 307/303; 307/296.4
[58] Field of Search .............. 307/296.1, 296.8, 296.6, 307/350, 272.3, 303, 296.4

[56] References Cited

U.S. PATENT DOCUMENTS

| | | | |
|---|---|---|---|
| 4,950,921 | 8/1990 | Takada | 307/296.1 |
| 5,132,555 | 7/1992 | Takahashi | 307/296.1 |
| 5,184,031 | 2/1993 | Hayakawa et al. | 307/296.1 |

Primary Examiner—John Zazworsky
Attorney, Agent, or Firm—Sughrue, Mion, Zinn Macpeak & Seas

[57] ABSTRACT

An internal step-down circuit is incorporated in an integrated circuit device for reduction in power consumption as well as for scaling-down, and produces an internal step-down power voltage level regulated to a reference voltage level internally produced by an internal reference signal generator, wherein a diagnostic circuit compares the reference voltage level with an external variable voltage level to see if or not the reference voltage level is higher than the external voltage level, and the external variable voltage level is changed to determine the matching point therebetween, thereby confirming the reference voltage level after packaging.

4 Claims, 4 Drawing Sheets

SEMICONDUCTOR INTEGRATED CIRCUIT EQUIPPED WITH DIAGNOSTIC CIRCUIT FOR CHECKING REFERENCE VOLTAGE SIGNAL SUPPLIED TO INTERNAL STEP-DOWN CIRCUIT

FIELD OF THE INVENTION

This invention relates to a semiconductor integrated circuit and, more particularly, to a diagnostic circuit for checking a reference voltage signal supplied to an internal step-down circuit after packaging.

DESCRIPTION OF THE RELATED ART

An ultra-large scaled integrated circuit is equipped with an internal step-down circuit, and the step-down voltage level is internally distributed to circuit components. The step-down voltage level is advantageous in view of power consumption as well as of scale-down of the component transistors. FIG. 1 shows a typical example of the internal step-down circuit 1 associated with an internal reference signal generator 2, and the internal step-down circuit 1 and the internal reference signal generator 2 form parts of an ultra-large scale integrated circuit fabricated on a single semiconductor chip 3. The internal reference signal generator 2 is coupled between a power voltage line Vcc and a ground voltage line GND, and the power voltage line Vcc propagates an external positive power voltage level to the internal reference signal generator 2 as well as the internal step-down circuit 1. The external positive power voltage level Vcc is stepped down to a reference voltage level Vref, and the reference voltage level Vref is supplied to the internal step-down circuit 1 as a reference signal. The internal step-down circuit 1 is also coupled between the power voltage line Vcc and the ground voltage line GND, and regulates a step-down power voltage level Vpi to the reference voltage level Vref. The step-down voltage level Vpi is distributed to circuit components instead of the external power voltage level Vcc. The ultra-large scale integrated circuit is equipped with a large number of pads where signal pins are coupled through extremely thin bonding wires. One of the pads 4 is assigned to the reference voltage level Vref, and the internal reference signal generator 2 supplies the reference voltage level Vref to the pad 4. However, any pin is not assigned to the reference voltage level Vref, and, for this reason, the reference voltage level Vref on the pad 4 is accessible while the pad 4 is exposed.

In diagnostic stage after completion of the fabrication process, a test probe is brought into contact with the pad 4, and the diagnostic system measures to see if or not the reference voltage level Vref is fallen within a target range. Fuse elements are incorporated in the internal reference signal generator 2, and the reference voltage level Vref is modified through a laser trimming of the fuse elements. If the reference voltage level Vref is fallen within the target range through the laser trimming, the ultra-large scale integrated circuit is rescued from rejection, and the semiconductor chip is molded into, for example, a plastic package.

After packaging the semiconductor chip, the pad 4 is covered with plastic, and any probe is never brought into contact with the pad 4. That is, the reference voltage level Vref is never accessible. However, while analyzing a trouble of a detective product, the analyst sometimes wants to confirm the reference voltage level Vref, and the prior art ultra-large integrated circuit never allows the analyst to check the reference voltage level Vref.

SUMMARY OF THE INVENTION

It is therefore an important object of the present invention to provide a semiconductor integrated circuit which allows checking a reference voltage level after packaging.

To accomplish the object, the present invention proposes to compare a reference voltage level with a variable voltage level supplied from the outside thereof to see if or not the reference voltage level falls within a target range.

In accordance with the present invention, there is provided an integrated circuit device fabricated on a semiconductor chip, comprising: a) an internal reference signal generator operative to produce a reference voltage level from an external voltage level; b) an internal step-down circuit responsive to the reference voltage level for producing a step-down voltage level with reference to the reference voltage, the step-down voltage level being distributed to predetermined component circuits of the integrated circuit device; and c) a diagnostic circuit associated with the internal reference signal generator to see whether or not the reference voltage level is fallen within a target range, and comprising c-1) a control unit responsive to a plurality of external signals for producing a plurality of internal control signals indicative of at least first and second phases of operation, c-2) a comparator unit activated in the first phase of operation, and operative to compare the reference voltage level with a variable voltage level supplied from the outside of the integrated circuit device for producing a diagnostic signal indicative of whether or not the reference voltage level is higher than the variable voltage level, and c-3) output means activated in the second phase of operation, and operative to supply the diagnostic signal to the outside of the integrated circuit device.

BRIEF DESCRIPTION OF THE DRAWINGS

The features and advantages of the semiconductor integrated circuit according to the present invention will be more clearly understood from the following description taken in conjunction with the accompanying drawings in which.

DESCRIPTION OF THE PREFERRED EMBODIMENT

Figure 2:
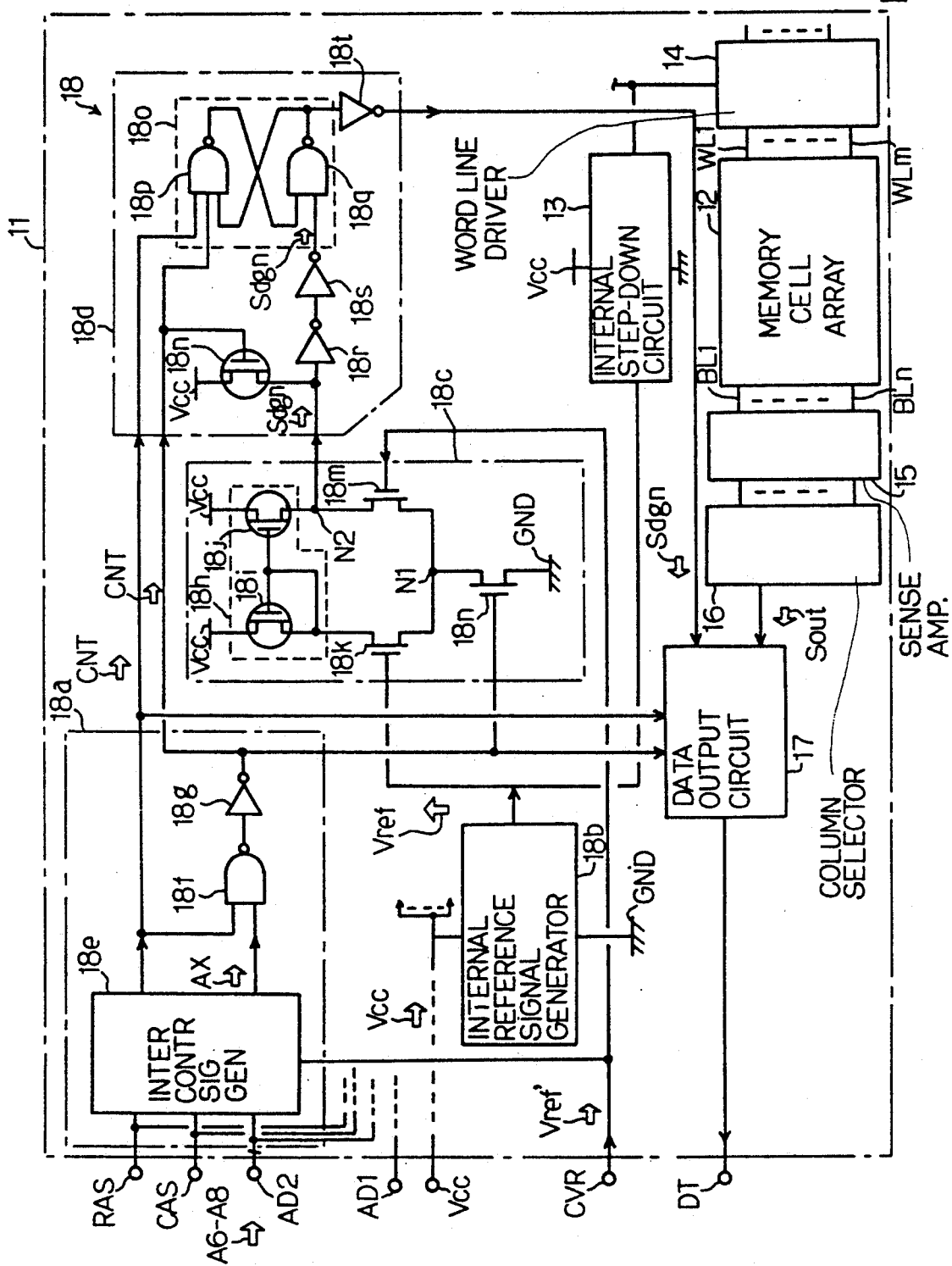
FIG. 2 is a circuit diagram showing the circuit arrangement of a random access memory device according to the present invention.

Referring to FIG. 2 of the drawings, a dynamic random access memory device embodying the present invention is fabricated on a single semiconductor chip 11, and a plurality of pins are provided for communication with external devices. A row address strobe signal and a column address signal are respectively applied to control signal pins labeled with RAS and CAS, and an external address signal is applied to address pins AD1 and AD2. Row and column addresses on the external address signals are latched in synchronism with the row and column address strobe signals, respectively, for addressing one of the memory cells in a memory cell array 12. In this instance, address bits A6 to A8 are supplied to the address pins AD2, and the other pins are supplied to the address bits AD1. A power voltage pin Vcc is assigned to an external positive power voltage level Vcc, and a comparative signal indicative of a variable reference voltage level Vref is supplied to a test pin CVR. A data pin DT is shared between an output data signal Sout as well as a diagnostic signal Sdgn indicative of diagnosis of a reference voltage level Vref. The dynamic random access memory device further comprises an internal step-down circuit 13 for producing a stepped-down power voltage level from the external positive power voltage level Vcc, a word line driver 14 associated with a row address decoder (not shown) for selectively driving word lines WL1 to WLm, a sense amplifier circuits for developing small differential voltage levels on bit line pairs BL1 to BLn, and a column selector 16 under the control of a column address decoder (not shown) for selectively interconnecting the bit line pairs BL1 to BLn to a data output circuit 17. However, these component circuits 13 to 16 are well known to a person skilled in the art, and no further description is incorporated hereinbelow for the sake of simplicity. In the following description, high and low voltage levels are assumed to correspond to logic "1" and logic "0", respectively.

Figure 1:
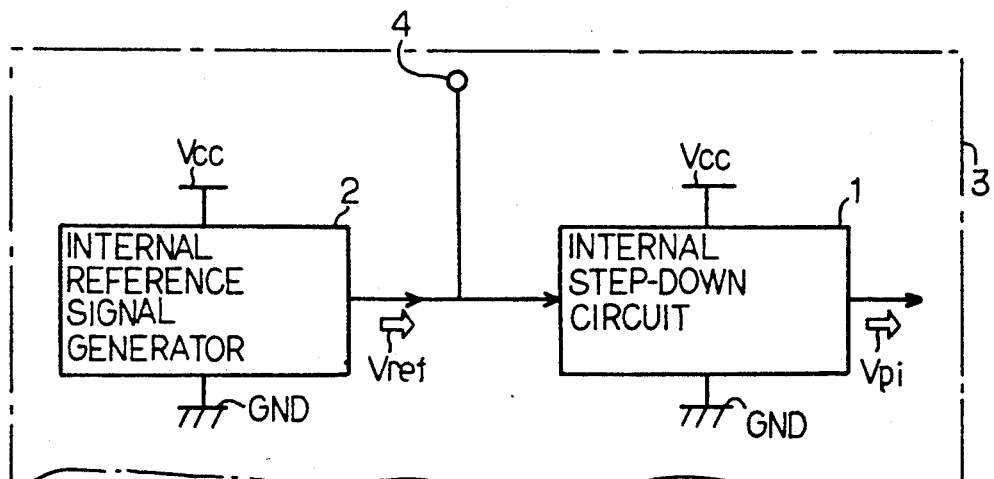
FIG. 1 is a block diagram showing the internal step-down circuit associated with the internal reference signal generator coupled with the pad.

The random access memory device further comprises a diagnostic unit 18, and the diagnostic unit 18 contains a diagnostic sub-unit for the reference voltage level Vref. The diagnostic sub-unit comprises a control circuit 18a, an internal reference signal generator 18b, a comparator 18c and a data latch circuit 18d. The control circuit 18a is responsive to the row address strobe signal, the column address strobe signal and the address bits A6 to A8, and operative to produce first and second control signals CNT1 and CNT2. Both of the first and second control signals CNT1 and CNT2 are distributed to the data latch circuit 18d and the data output circuit 17, and only the second control signal CNT2 is supplied to the comparator 18c. The internal reference signal generator 18b is coupled between the external positive power voltage line Vcc and a ground voltage line GND, and produces the reference voltage level Vref as similar to that of the prior art shown in FIG. 1. The reference voltage level Vref and the comparative signal indicative of the variable reference voltage level Vref' are supplied to the comparator 18c, and the comparator 18c compares the reference voltage level Vref with the variable reference voltage level Vref' in the presence of the second control signal CNT2 so as to produce the diagnostic signal Sdgn. The diagnostic signal Sdgn is indicative of whether or not the reference voltage level Vref is higher than the variable reference voltage level Vref', and is stored in the data latch circuit 18d in the co-presence of the first and second control signals CNT1 and CNT2. Since the data output circuit 17 couples the data latch circuit 18d with the data pin DT in the co-presence of the first and second control signals CNT1 and CNT2, the data latch circuit 18d can supply the diagnostic signal Sdgn through the data output circuit 17 to the data pin DT.

The control circuit 18a comprises an internal control signal generator 18e responsive to the row address strobe signal, the column address strobe signal, the comparative signal indicative of the variable reference voltage level Vref' and the address bits A6 to A8 for producing the first control signal CNT1 and an auxiliary control signal Ax, a NAND gate 18f and an inverting circuit 18g for producing the second control signal CNT2, and the first and second control signals CNT1 and CNT2 allows the diagnostic sub-unit to selectively enter a test-mode entry cycle, a comparing cycle and a data read-out cycle. These three cycles are described hereinlater in detail in connection with circuit behavior of the diagnostic sub-unit 18.

The comparator 18c comprises a current mirror circuit 18h implemented by two p-channel enhancement type field effect transistors 18i and 18j coupled with the external positive power voltage line Vcc, a pair of n-channel enhancement type amplifying transistors 18k and 18m coupled in parallel with the current mirror circuit 18h, and an n-channel enhancement type activation transistor 18n coupled between the common source node N1 of the amplifying transistors 18k and 18m and the ground voltage line GND. The second control signal CNT2 of high voltage level causes the n-channel enhancement type activation transistor 18n to turn on, and, accordingly, allows the n-channel enhancement type amplifying transistors 18k and 18m to become responsive. The reference voltage level Vref and the variable reference voltage level Vref' are respectively supplied to the gate electrodes of the n-channel enhancement type amplifying transistors 18k and 18m, and the n-channel enhancement type amplifying transistors 18k and 18m develops differential voltage level between the reference voltage level Vref and the variable reference voltage level Vref' in the presence of the second control signal CNT2 of the high voltage level, thereby producing the diagnostic signal Sdgn at an output node N2 thereof. However, while the second control signal CNT2 remains low, the n-channel enhancement type amplifying transistors 18k and 18m never develops the differential voltage level, nor produces any diagnostic signal Sdgn.

The data patching circuit 18d comprises a p-channel enhancement type pull-up transistor 18n coupled between the external positive power voltage line Vcc and the output node N2, an R-S flip flop circuit 18o implemented by two NAND gates 18p and 18q for storing the diagnostic signal Sdgn, a series combination of two inverting circuits 18r and 18s coupled between the output node N2 and the R-S flip flop circuit 18o, and an inverting circuit 18t coupled between the R-S flip flop circuit 18o and the data output circuit 17. The p-channel enhancement type pull-up transistor 18n is responsive to the second control signal CNT2 of the low voltage level, and maintains the output node N2 in positive high voltage level while the comparator 18c remains inactive. The series combination of the inverting circuits 18r and 18s are provided for amplification as well as waveform shaping, and relays the diagnostic signal Sdgn to the R-S flip flop circuit 18o.

The R-S flip flop circuit 18o is enabled with the first and second control signals CNT1 and CNT2 of the high voltage level. If either or both of the first and second control signals CNT1 and CNT2 are in the low voltage level, the NAND gate 18p produces an output signal of the high voltage level at all times, and the NAND gate 18q produces the low voltage level because the p-channel enhancement type pull-up transistor 18n supplies the high voltage level through the inverting circuits 18r and 18s to the NAND gate 18q.

Figure 3:
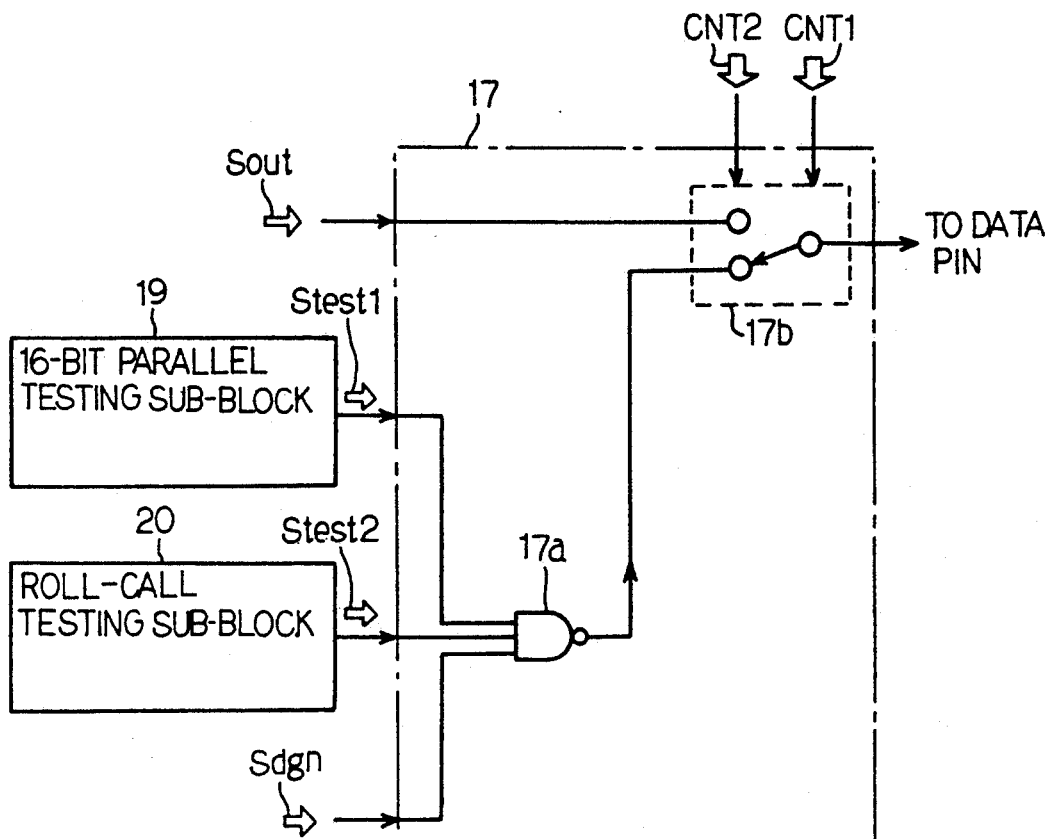
FIG. 3 is a circuit diagram showing the circuit arrangement of a data output circuit incorporated in the dynamic random access memory device shown in FIG. 2.

The data output circuit 17 is illustrated in detail in FIG. 3, and comprises a NAND gate 17a and a switching unit 17b. The NAND gate 17a has three input nodes coupled with a 16-bit parallel testing sub-block 19, a roll-call testing sub-block 20 and the data latching circuit 18d. The 16-bit parallel testing sub-block 19 and the roll-call testing sub-block 20 form parts of the diagnostic unit. The 16-bit parallel testing sub-block 19 compares sixteen test data bits read out from the memory cell array 12, and compares the sixteen test data bits to see whether or not they are consistent in logic level with one another. If the sixteen test data bits are consistent in logic level with one another, the memory cells for storing the test data bits are excellent, and the 16-bit parallel testing sub-block 19 supplies a test data signal Stest1 of the high voltage level indicative of the consistency to the data output circuit 17. However, if any one of the test data bits is different in logic level from the other test data bits, the memory cell array 12 contains a detective memory cell, and the row of memory cells containing the detective memory cell is replaced with a row of redundant memory cells. In this situation, the test data signal Stest1 goes down to the low voltage level. The roll-call testing sub-block 20 checks a redundant memory cell array to see if or not any one of the redundant memory cells is replaced with a defective memory cell. If a redundant memory cell is replaced with a defective memory cell, the test data signal Stest2 goes up to the high voltage level. However, if not, the test data signal Stest2 remains low. The 16-bit parallel testing sub-block 19 and the roll-call testing sub-block 20 are activated with respective combinations of external control signals. However, the combinations are different with each other, and are further different from the combination of the row address strobe signal, the column address strobe signal and the address bits A6 to A8. For this reason, any two of the diagnostic sub-units 18, 19 and 20 are never simultaneously activated, and the test data signals Stest1 and Stest2 are kept in the high voltage level while the 16-bit parallel testing sub-block 19 and the roll-call testing sub-block 20 remain inactive. In other words, while the 16-bit parallel testing sub-block 19 and the roll-call testing sub-block 20 remain inactive, the NAND gate 17a is enabled with the test data signals Stest1 and Stest2, and serves as an inverting circuit for the diagnostic signal Sdgn. The switching unit 17b couples the data latching circuit 18d with the data pin DT in the co-presence of the first and second control signals CNT1 and CNT2 of the high voltage level, and transfers the output data signal Sout to the data pin DT in so far as at least one of the first and second control signals CNT1 and CNT2 remains in low.

Figure 4:
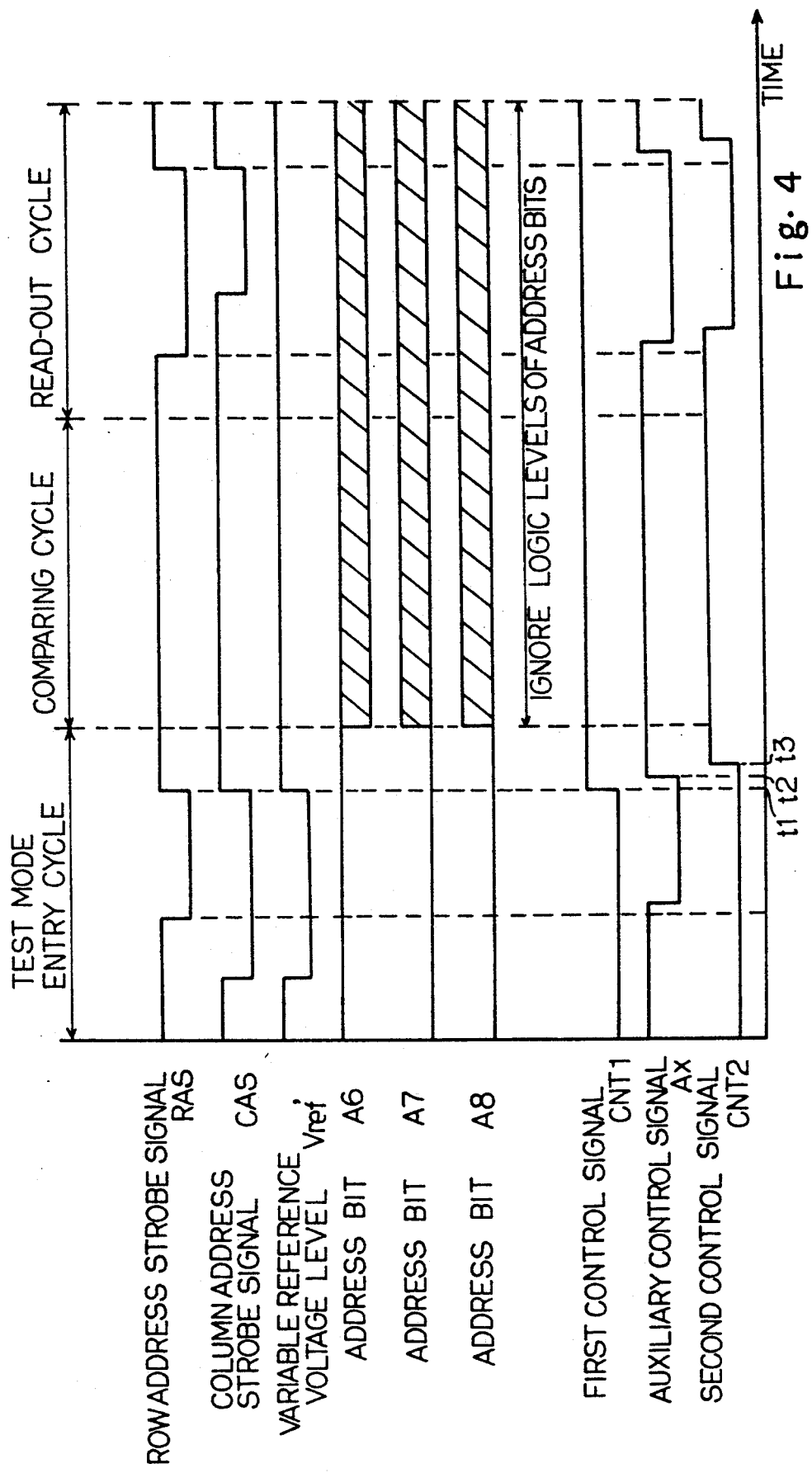
FIG. 4 is a diagram showing the waveforms of essential signals in the dynamic random access memory device shown in FIG. 2.
Figure 5:
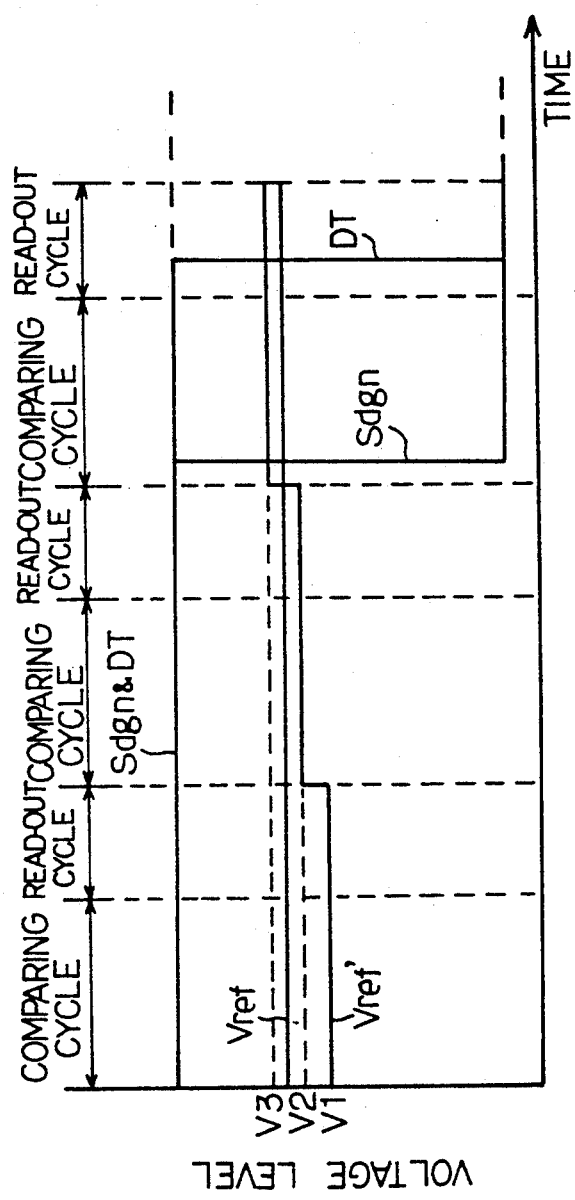
FIG. 5 is a diagram showing a diagnostic sequence for a reference voltage level.

Description is hereinbelow made on circuit behavior of the diagnostic sub-unit 18 with reference to FIGS. 4 and 5 of the drawings. If the row address strobe signal RAS and the column address strobe signal CAS are stepped down to active low voltage level together with the variable reference voltage level Vref' of the lowest voltage level, the random access memory device enters a test mode entry cycle. If the address bit A6 is in the high voltage level and the address bits A7 and A8 are in the low voltage level, the random access memory device acknowledged itself to be expected to check the reference voltage level Vref. Then, the first control signal CNT1 goes up to the high voltage level at time t1. With the first control signal CNT1 of the high voltage level, the NAND gate 18f is enabled, and the auxiliary control signal Ax is stepped up at time t2 so that the inverting circuit 18g allows the second control signal CNT2 to go up at time t3. The second control signal CNT2 is a in-phase signal of the row address strobe signal RAS, and, accordingly, follows the row address strobe signal RAS. However, the first control signal CNT1 is fixed to the high voltage level over the comparing cycle and the read-out cycle.

After the entry into the test mode entry cycle, the random access memory device proceeds to a comparing cycle. Since the row address strobe signal is fixed to the high voltage level over the comparing cycle, the second control signal CNT2 remains in the high voltage level over the comparing cycle. The second control signal CNT of the high voltage level activates the comparator 18c, and causes the p-channel enhancement type pull-up transistor 18n to turn off. The internal reference signal generator 18b produces the internal reference signal indicative of the reference voltage level Vref, and the reference voltage level Vref is supplied to the gate electrode of the n-channel enhancement type amplifying transistor 18k. The variable reference signal Vref' goes up to a first predetermined voltage level, and is supplied to the gate electrode of the n-channel enhancement type amplifying transistor 18m. Since the second control signal CNT2 has already allowed the n-channel enhancement type activation transistor 18n to turn on, differential voltage level between the gate electrodes of the n-channel enhancement type amplifying transistors 18k and 18m is developed, if any. The differential voltage level thus developed is relayed through the inverting circuits 18r and 18s to the R-S flip flop circuit 18o, because the p-channel enhancement type pull-up transistor 18n is turned off.

Finally, when the row address strobe signal RAS is stepped down, the random access memory device proceeds to the read-out cycle, and the diagnostic signal Sdgn indicative of the differential voltage level is latched by the R-S flip flop circuit 18o, and the R-S flip flop circuit 18o supplies the diagnostic signal Sdgn through the inverting circuit 18t and the data output circuit 17 to the data pin DT.

Thus, the voltage level at the data pin DT is indicative of the differential voltage level between the reference voltage level Vref and the variable reference voltage level Vref', and the analyst can determine the reference voltage level Vref by changing the variable voltage level Vref'. Namely, the random access memory device repeats the comparing cycle and the read-out cycle by shifting the row address strobe signal RAS between the high and low voltage levels as shown in FIG. 5, and the variable reference voltage level Vref' is increased from V1 through V2 to V3. If the variable reference voltage level Vref' exceeds the reference voltage level Vref in the third comparing cycle, the comparator 18c changes the diagnostic signal Sdgn from the high voltage level to the low voltage level, and the data pin DT is stepped down in the next read-out cycle. From the step-down of the data pin DT, the analyst determines the reference voltage level Vref between V2 and V3.

In this instance, while the row address strobe signal RAS remains in the high voltage level, the comparator 18c compares the reference voltage level Vref and the variable reference voltage level Vref', and the diagnostic signal Sdgn is latched upon the step-down of the row address strobe signal RAS. This sequence is advantageous in view of the exact comparison, because noise in the high voltage level is less than that in the low voltage level. It is impossible to read out the diagnostic signal Sdgn in the high voltage level of the row address strobe signal, and the data latching circuit 18d is indispensable, because the step-down of the row address strobe signal RAS causes the second control signal CNT2 to deactivate the comparator 18c.

As will be understood from the foregoing description, the random access memory device according to the present invention allows an analyst to check the exact reference voltage level Vref after the package of the semiconductor chip, and this function is attractive in view of trouble shooting. Moreover, the 16-bit parallel testing sub-block 19 and the roll-call testing sub-block 20 have been incorporated in a dynamic random access memory device, and the diagnostic sub-unit 18 can share parts of the circuit arrangement with those sub-blocks 19 and 20. For this reason, the diagnostic sub-unit 18 merely occupies a small amount of real estate of the semiconductor chip.

Although particular embodiments of the present invention have been shown and described, it will be obvious to those skilled in the art that various changes and modifications may be made without departing from the spirit and scope of the present invention. For example, the diagnostic sub-unit 18 is available for confirmation of any internally produced step-down voltage level as well as any internal signal at a step-down voltage level. Moreover, the address bits A6 to A8 may cause the diagnostic sub-block 18 to alternately check the reference voltage level Vref and the step-down power voltage level by changing the address bits A6 to A8. Finally, the diagnostic sub-unit 18 may be incorporated in any integrated circuit using a step-down power voltage level.

What is claimed is:

1. An integrated circuit device fabricated on a semiconductor chip, comprising:
    a) an internal reference signal generator operative to produce a reference voltage level from an external voltage level;
    b) an internal step-down circuit responsive to said reference voltage level for producing a step-down voltage level with reference to said reference voltage, said step-down voltage level being distributed to predetermined component circuits of said integrated circuit device; and
    c) a diagnostic circuit associated with said internal reference signal generator to see whether or not said reference voltage level is fallen within a target range, and comprising c-1) a control unit responsive to a plurality of external signals for producing a plurality of internal control signals indicative of at least first and second phases of operation, c-2) a comparator unit activated in said first phase of operation, and operative to compare said reference voltage level with a variable voltage level supplied from the outside of said integrated circuit device for producing a diagnostic signal indicative of whether or not said reference voltage level is higher than said variable voltage level, and c-3) output means activated in said second phase of operation, and operative to supply said diagnostic signal to the outside of said integrated circuit device.

2. An integrated circuit device as set forth in claim 1, in which said comparator unit comprises a current mirror circuit coupled with a first voltage line of said external voltage line for producing first and second currents approximately equal to one another, a pair of amplifying transistors supplied with said first and second currents from said current mirror circuit and responsive to said reference voltage level and said variable voltage level, respectively, for producing said diagnostic signal, and an activation transistor responsive to one of said plurality of control signals for coupling said pair of amplifying transistors with a second voltage line of a constant voltage level.

3. An integrated circuit device as set forth in claim 1, in which said output means comprises a data latching circuit responsive to said plurality of internal control signals for temporally storing said diagnostic signal, and a data output circuit responsive to said plurality of internal control signals for transferring said diagnostic signal from said data latching circuit to a data pin.

4. An integrated circuit device as set forth in claim 3, in which said data latching circuit comprises a pull-up transistor coupled between said first voltage line and an output node of said comparator unit and responsive to the complementary signal of said one of said plurality of internal control signals, a waveform shaping circuit coupled with said output node of said comparator unit, and a flip flop circuit enabled with said plurality of internal control signals and storing said diagnostic signal supplied from said waveform shaping circuit.

* * * * *

UNITED STATES PATENT AND TRADEMARK OFFICE
CERTIFICATE OF CORRECTION

PATENT NO. : 5,287,012
DATED : February 15, 1994
INVENTOR(S) : Yasuji KOSHIKAWA

It is certified that error appears in the above-identified patent and that said Letters Patent is hereby corrected as shown below:

Col. 3, line 25, after "circuits" insert --15--.

Signed and Sealed this

Ninth Day of August, 1994

Attest:

BRUCE LEHMAN

Attesting Officer                Commissioner of Patents and Trademarks